United States Patent
Balseanu et al.

(10) Patent No.: US 8,536,069 B2
(45) Date of Patent: Sep. 17, 2013

(54) MULTILAYERED LOW K CAP WITH CONFORMAL GAP FILL AND UV STABLE COMPRESSIVE STRESS PROPERTIES

(75) Inventors: Mihaela Balseanu, Cupertino, CA (US); Stephan A. Cohen, Wappingers Falls, NY (US); Alfred Grill, White Plains, NY (US); Thomas J. Haigh, Jr., Claverack, NY (US); Son V. Nguyen, Schenectady, NY (US); Li-Qun Xia, Cupertino, CA (US)

(73) Assignees: International Business Machines Corporation, Armonk, NY (US); Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/612,159

(22) Filed: Sep. 12, 2012

(65) Prior Publication Data
US 2013/0005146 A1  Jan. 3, 2013

Related U.S. Application Data

(63) Continuation of application No. 13/078,305, filed on Apr. 1, 2011.

(51) Int. Cl.
*H01L 21/469* (2006.01)
*H01L 23/58* (2006.01)

(52) U.S. Cl.
USPC ............................................. 438/780; 257/642

(58) Field of Classification Search
USPC .............. 257/637–649, 751, E21.5–E21.504; 438/725, 780
See application file for complete search history.

(56) References Cited

U.S. PATENT DOCUMENTS

| | | | | |
|---|---|---|---|---|
| 6,740,977 | B2 * | 5/2004 | Ahn et al. | 257/760 |
| 7,138,717 | B2 * | 11/2006 | Wang et al. | 257/760 |
| 7,737,052 | B2 | 6/2010 | Bhatia et al. | |
| 2009/0079083 | A1 | 3/2009 | Yang | |
| 2011/0012238 | A1 * | 1/2011 | Cohen et al. | 257/637 |

OTHER PUBLICATIONS

Verghese, M. et al., "Atomic layer deposition goes mainstream in 22nm logic technologies", Solid State Technology, Nov. 2010.

* cited by examiner

*Primary Examiner* — Calvin Lee
(74) *Attorney, Agent, or Firm* — Scully, Scott, Murphy & Presser, P.C.; Louis J. Percello, Esq.

(57) ABSTRACT

The present disclosure provides a multilayered cap (i.e., migration barrier) that conforms to the substrate (i.e., interconnect structure) below. The multilayered cap, which can be located atop at least one interconnect level of an interconnect structure, includes, from bottom to top, a first layer comprising silicon nitride and a second layer comprising at least one of boron nitride and carbon boron nitride.

20 Claims, 6 Drawing Sheets

MULTILAYERED LOW K CAP WITH CONFORMAL GAP FILL AND UV STABLE COMPRESSIVE STRESS PROPERTIES

CROSS REFERENCE TO RELATED APPLICATION

This application is a continuation of U.S. patent application Ser. No. 13/078,305, filed Apr. 1, 2011 the entire content and disclosure of which is incorporated herein by reference.

BACKGROUND

The present disclosure relates to a semiconductor structure and a method of forming the same. More particularly, the present disclosure relates to a multilayered low dielectric constant (k) cap that can be present on at least one interconnect level of an interconnect structure. The present disclosure also provides methods of forming such a multilayered cap as well as an interconnect structure including the same.

Generally, semiconductor devices include a plurality of circuits that form an integrated circuit (IC) fabricated on a semiconductor substrate. A complex network of signal paths will normally be routed to connect the circuit elements distributed on the surface of the substrate. Efficient routing of these signals across the device requires formation of multilevel or multilayered schemes, such as, for example, single or dual damascene wiring structures. The wiring structure typically includes copper, Cu, since Cu based interconnects provide higher speed signal transmission between large numbers of transistors on a complex semiconductor chip as compared with aluminum, Al, based interconnects.

Within a typical interconnect structure, metal vias run perpendicular to the semiconductor substrate and metal lines run parallel to the semiconductor substrate. Further enhancement of the signal speed and reduction of signals in adjacent metal lines (known as "crosstalk") are achieved in today's IC product chips by embedding the metal lines and metal vias (e.g., conductive features) in a dielectric material having a dielectric constant of less than 4.0.

Figure 1A:
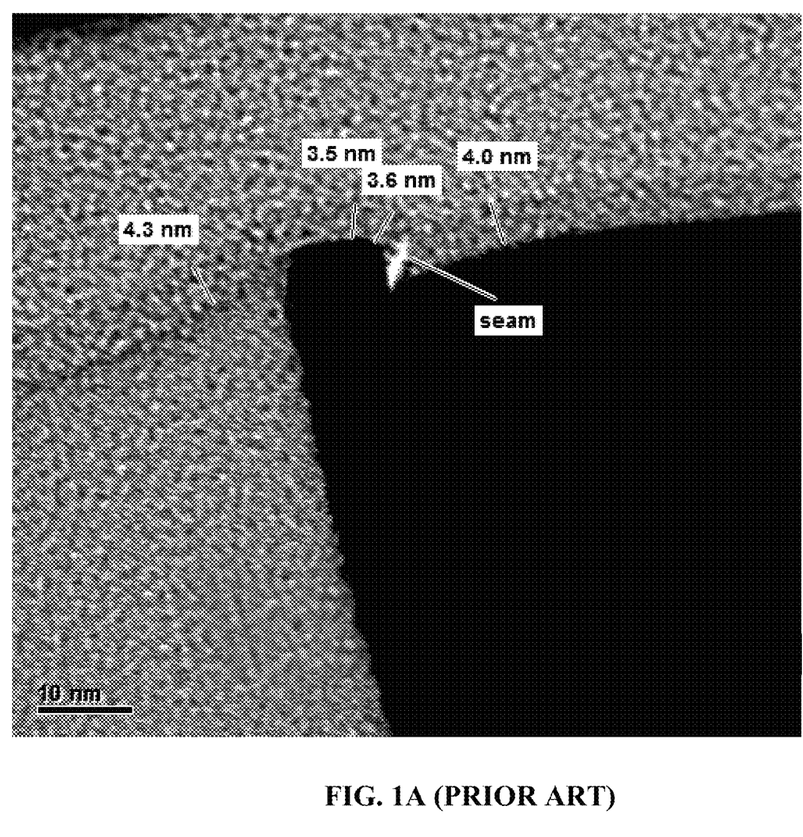
FIGS. 1A and 1B are cross-sectional scanning electron micrographs (SEMs) of a prior art Cu interconnect structure including a nitrogen and hydrogen doped silicon carbide SiC (N,H) cap which illustrates the formation of a seam, i.e., void, between the Cu region and the dielectric material at the corners of the Cu interconnect structure.
Figure 1B:
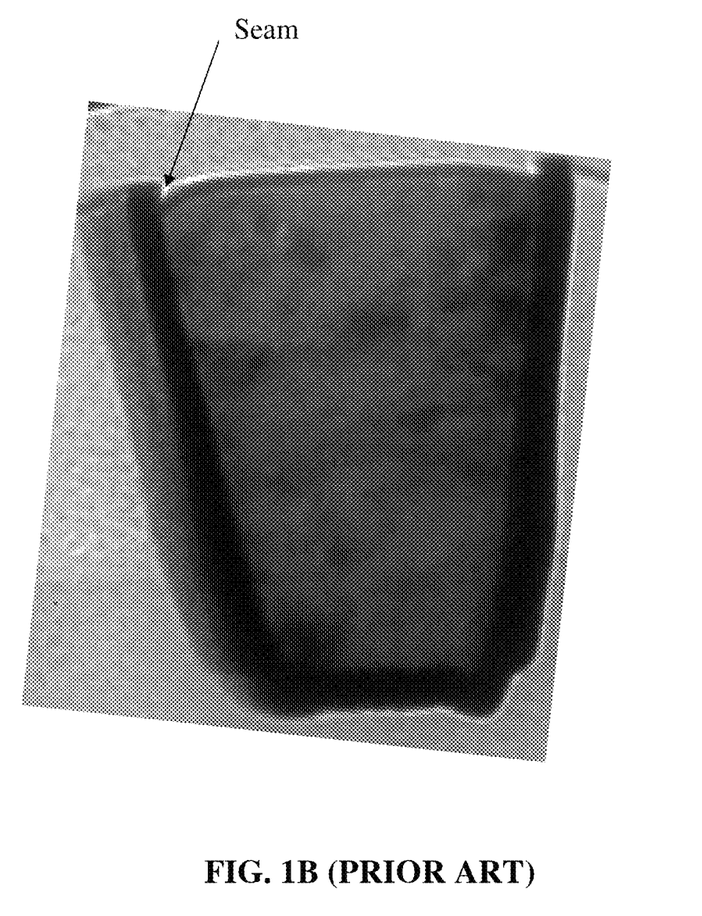

Current Cu interconnect structures typically include a dielectric cap thereon which provides some degree of electromigration (EM) resistance to the interconnect structure (i.e., Cu diffusion barrier). The dielectric cap can include a nitrogen and hydrogen doped silicon carbide SiC(N,H) which is typically formed by a plasma enhanced chemical vapor deposition (PECVD) process. Such dielectric caps do not have sufficient conformal fill capacity to fill a recess in the Cu that forms during processing of the interconnect structure. As the result, prior art dielectric caps provide poor step coverage to the underlying Cu region and oftentimes seams form between the Cu region and the dielectric material, particularly at the corners of the interconnect structure between the Cu region and the adjacent dielectric material. Such a Cu interconnect structure is illustrated in the SEMs of FIGS. 1A and 1B. The presence of such seams can cause poor reliability and adhesion problems in prior art interconnect structures.

SUMMARY

In one embodiment, the present disclosure provides a multilayered cap (i.e., Cu diffusion/migration barrier) that conforms to the substrate (i.e., interconnect structure) below. The multilayered cap, which can be located atop at least one interconnect level of an interconnect structure, includes, from bottom to top, a first layer comprising silicon nitride and a second layer comprising at least one of boron nitride and carbon boron nitride. The multilayered cap of the present disclosure conformally fills seams or voids to reduce stress cracking in the substrate. Moreover, the multilayered cap of the present disclosure provides improved electromigration resistance to an interconnect structure containing the same.

In another embodiment, the present disclosure provides a semiconductor structure that includes the aforementioned multilayered cap located atop a surface of a substrate. Specifically, the semiconductor structure of the present disclosure includes a dielectric material having at least one conductive region embedded, i.e., in-laid, therein. The structure of the present disclosure further includes a multilayered cap located at least on an upper surface of the at least one conductive region embedded in the dielectric material. The multilayered cap comprises, from bottom to top, a first layer comprising silicon nitride, and a second layer comprising at least one of boron nitride and carbon boron nitride.

In yet another embodiment, the present disclosure provides a method of forming the aforementioned multilayered cap on a surface of a substrate. Specifically, the method includes providing a substrate; forming a first layer comprising silicon nitride on an upper surface of the substrate; and forming a second layer comprising at least one of boron nitride and carbon boron nitride on an upper surface of the first layer, wherein the second layer is formed by at least one of plasma enhanced chemical vapor deposition, plasma enhanced atomic layer deposition and atomic layer deposition.

DETAILED DESCRIPTION

The present disclosure, which provides a multilayered cap for use as a migration barrier (i.e., Cu diffusion barrier in a Cu interconnect) in semiconductor structures, such as interconnect structures, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

As stated above, the present disclosure provides a multilayered cap that conforms to the substrate (i.e., interconnect structure) below. The multilayered cap, which can be located atop at least one interconnect level of an interconnect structure, includes, from bottom to top, a first layer comprising silicon nitride and a second layer comprising at least one of boron nitride and carbon boron nitride. The multilayered cap of the present disclosure conformally fills seams or voids to reduce stress cracking in the substrate. Moreover, the multilayered cap of the present disclosure prevents oxidation of the substrate. In addition, the multilayered cap of the present disclosure has improved UV stability stress control as compared with prior art dielectric caps.

Reference is now made to FIGS. 2-7 which illustrate an embodiment of the present disclosure in which the multilayered cap is employed as a migration barrier (i.e., Cu diffusion barrier in a Cu interconnect) for an interconnect structure. Although the multilayered cap of the present disclosure is being illustrated as a migration barrier for use in an interconnect structure, the multilayered cap can also be used in other structures in which a migration resistant barrier is needed.

Figure 2:
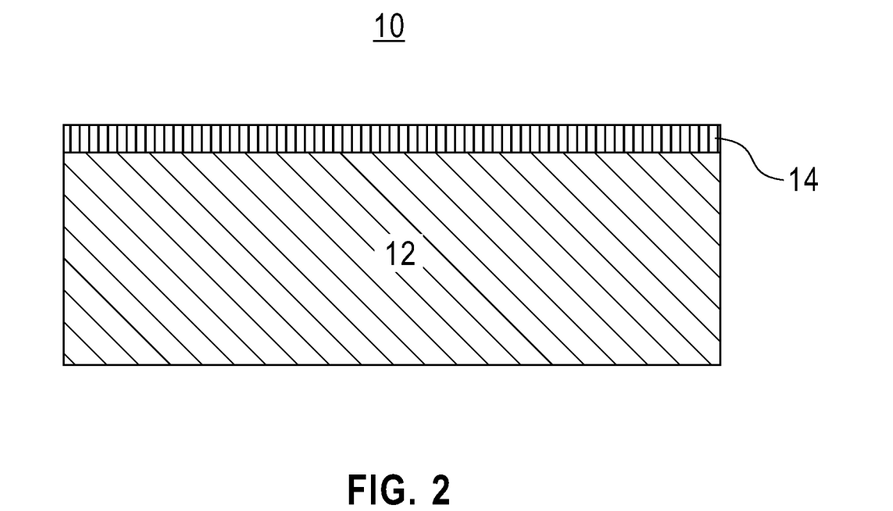
FIG. 2 is a pictorial representation (through a cross sectional view) illustrating an initial structure including, from bottom to top, a dielectric material and a layer of pad (mask) material that can be employed in one embodiment of the present disclosure.

Referring first to FIG. 2, there is illustrated an initial structure 10 that can be employed in one embodiment of the present disclosure. The initial structure 10 includes at least a dielectric material 12 having a layer of pad (mask) material 14 located on an upper surface thereof.

The initial structure 10 is typically located upon a substrate (not shown in the drawings of the present application). The substrate may comprise a semiconducting material, an insulating material, a conductive material or any combination including multilayers thereof. When the substrate is comprised of a semiconducting material, any semiconductor such as Si, SiGe, SiGeC, SiC, Ge alloys, GaAs, InAs, InP and other III/V or II/VI compound semiconductors may be used. In addition to these listed types of semiconducting materials, the present disclosure also contemplates cases in which the semiconductor substrate is a layered semiconductor such as, for example, Si/SiGe, Si/SiC, silicon-on-insulators (SOIs) or silicon germanium-on-insulators (SGOIs).

When the substrate is an insulating material, the insulating material can be an organic insulator, an inorganic insulator or combinations thereof including multilayers. When the substrate is a conducting material, the substrate may include, for example, polySi, an elemental metal, alloys of elemental metals, a metal silicide, a metal nitride or combinations thereof including multilayers. When the substrate comprises a semiconducting material, one or more semiconductor devices such as, for example, complementary metal oxide semiconductor (CMOS) devices can be fabricated thereon.

When the substrate comprises a combination of an insulating material and a conductive material, the substrate may represent one interconnect level of a multilayered interconnect structure.

The dielectric material 12 of the initial structure 10 comprises any interlevel or intralevel dielectric including inorganic dielectrics or organic dielectrics. The dielectric material 12 may be porous, non-porous or contain regions and/or surfaces that are porous and other regions and/or surfaces that may be non-porous. In some embodiments, porous dielectric materials are employed as dielectric material 12 since porous dielectrics have a lower dielectric constant than the equivalent non-porous version of the dielectric material.

Some examples of suitable dielectrics that can be used as the dielectric material 12 include, but are not limited to silicon oxide, silsesquioxanes, C doped oxides (i.e., SiCOH or organosilicates) that include atoms of Si, C, O and H, porous SiCOH (pSiCOH), thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material 12 typically has a dielectric constant that is about 4.0 or less, with a dielectric constant of about 2.8 or less being even more typical. All dielectric constants mentioned herein are relative to a vacuum, unless otherwise noted. Dielectrics having such dielectric constants generally have a lower parasitic cross talk as compared with dielectric materials that have a higher dielectric constant than about 4.0.

The thickness of the dielectric material 12 may vary depending upon the dielectric material used as well as the exact number of dielectric layers within the dielectric material 12. Typically, and for normal interconnect structures, the dielectric material 12 has a thickness from 50 nm to 1000 nm. Other thicknesses for the dielectric material 12 can also be employed in the present disclosure.

The dielectric material 12 can be formed utilizing a conventional deposition process including, but not limited to chemical vapor deposition (CVD), plasma enhanced chemical vapor deposition (PECVD), evaporation, chemical solution deposition and spin-on coating. In some applications, such as, for example, spin-on coating, a curing step can follow the deposition step so as to remove any unwanted solvent from the deposited dielectric material 12.

After forming the dielectric material 12, the layer of pad material, i.e., mask material, 14 is formed on an exposed upper surface of dielectric material 12. The layer of pad material 14 comprises an oxide, nitride, oxynitride or multilayers thereof (e.g., a pad stack comprising a pad oxide and a pad nitride). The layer of pad material 14 typically comprises a semiconductor oxide, semiconductor nitride and/or a semiconductor oxynitride. Preferably, the layer of pad material 14 comprises an oxide of silicon and/or a nitride of silicon.

In some embodiments, the layer of pad material 14 may be formed utilizing any conventional deposition process including, for example, CVD, PECVD, evaporation, chemical solution deposition, physical vapor deposition (PVD) and atomic layer deposition (ALD). In other embodiments, the layer of pad material 14 can be formed by a thermal process such as, for example, a thermal oxidation, a thermal nitridation and/or a thermal oxynitridation process. In yet other embodiments, the layer of pad material 14 is formed utilizing a combination of deposition and thermal processes.

The thickness of the layer of pad material 14 may vary depending on the number of materials within the layer itself as well as the technique that was used in forming the same. Typically, the layer of pad material 14 has a thickness from 10 nm to 80 nm. Other thicknesses for the layer of pad material 14 can also be employed in the present disclosure.

After forming the initial structure 10 shown in FIG. 2, at least one opening 16 is formed into the layer of pad material 14 and into a portion of dielectric material 12. The resultant structure including the at least one opening 16 is shown, for example, in FIG. 3. The at least one opening 16 may include a via opening, a line opening, a combined via and line opening, or any combination thereof. When a combination is employed, the opening 16 can include a line opening atop a via opening, or a via opening atop a line opening. In the drawings, a line opening is shown by way of a non-limiting example. It is also observed that while the present disclosure illustrates and describes a single opening formed into the dielectric material 12, the present disclosure is not limited to only a single opening 16 being formed. Instead, a plurality of openings can be formed into the dielectric material 12.

Figure 3:
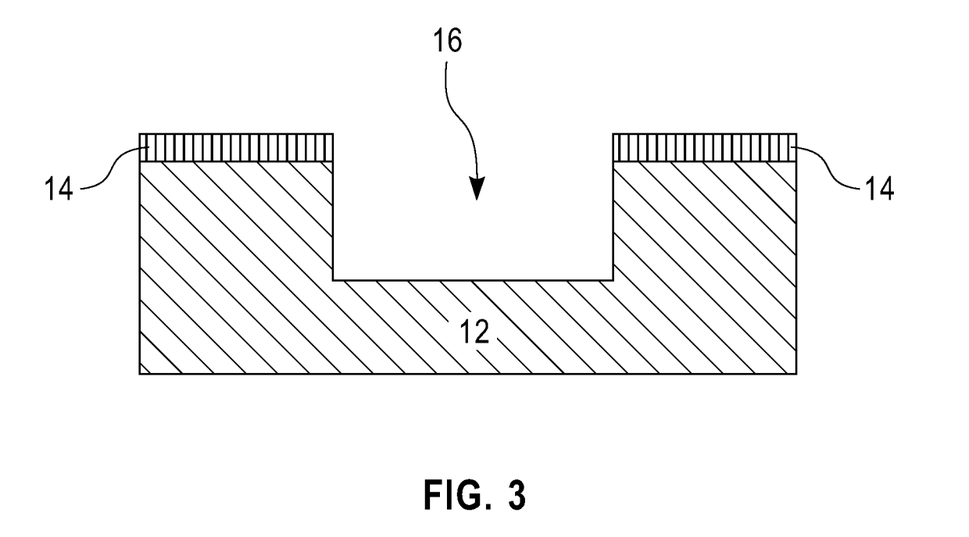
FIG. 3 is a pictorial representation (through a cross sectional view) illustrating the initial structure of FIG. 2 after forming at least one opening into the layer of pad (mask) material and a portion of the dielectric material.

The at least one opening 16 can be formed utilizing lithography and etching. In some embodiments, a single damascene process can be employed in forming the at least one opening 16. A single damascene includes lithography and etching. In another embodiment, a dual damascene process is employed. A dual damascene process includes two iterations of lithography and etching.

The lithographic step includes forming a photoresist (organic, inorganic or hybrid) atop the layer of pad material 14 utilizing a deposition process such as, for example, CVD, PECVD and spin-on coating. Following formation of the photoresist, the photoresist is exposed to a desired pattern of radiation. Next, the exposed photoresist is developed utilizing a conventional resist developer. After the development step, an etching step is performed to transfer the pattern from the patterned photoresist first into the layer of pad material 14 and then into the dielectric material 12. The patterned photoresist is typically, but not necessarily always, removed from the surface of the structure after transferring the pattern into the layer of pad material 14 utilizing a conventional resist stripping process such as, for example, ashing. The etching step used in forming the at least one opening 16 comprises a dry etching process (including reactive ion etching, ion beam etching, plasma etching or laser ablation), a wet chemical etching process or any combination thereof. Typically, reactive ion etching is used to form the at least one opening 16. In some embodiments of the present disclosure, the patterned resist can be removed after transferring the opening into the dielectric material 12 utilizing a resist stripping process, such as, for example, ashing.

Figure 4:
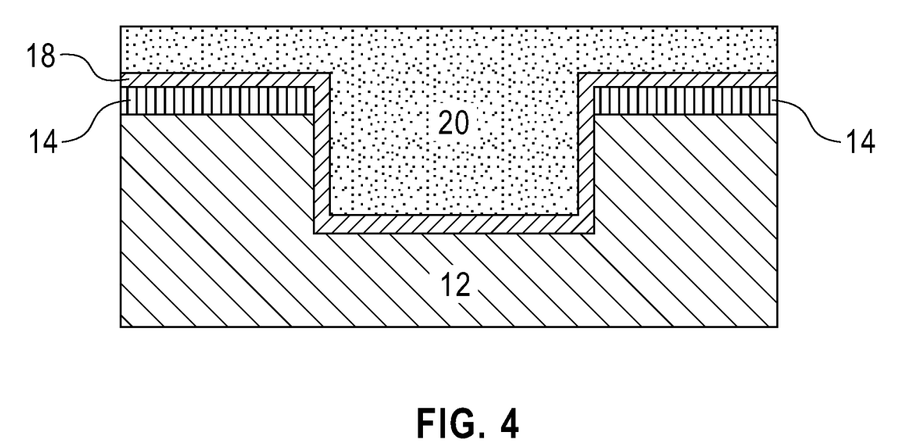
FIG. 4 is a pictorial representation (through a cross sectional view) illustrating the structure of FIG. 3 after formation of a diffusion barrier and a conductive material.

Referring now to FIG. 4, there is shown the structure of FIG. 3 after formation of a diffusion barrier 18 and a conductive material 20. As shown, the diffusion barrier 18 and conductive material 20 are formed onto an upper surface of remaining portions of the layer of pad material 14 as well as into each of the at least one openings 16.

The diffusion barrier 18 can comprise Ta, TaN, Ti, TiN, Ru, RuN, RuTa, RuTaN, IrTa, IrTaN, W, WN or any other material that can serve as a barrier to prevent conductive material from diffusing there through. The thickness of the diffusion barrier 18 may vary depending on the deposition process used as well as the material employed. Typically, the diffusion barrier 18 has a thickness from 4 nm to 40 nm, with a thickness from 7 nm to 20 nm being more typical. Other thicknesses can also be employed for the diffusion barrier 18.

The diffusion barrier 18, which in the at least one opening is located between the conductive material 20 and the dielectric material 12, can be formed by any conventional deposition process including, for example, CVD, PECVD, PVD, sputtering and plating.

In some embodiments (not shown), a plating seed layer can be formed atop the barrier layer 18 prior to deposition of the conductive material 20. The plating seed layer is employed to selectively promote subsequent electroplating of a pre-selected conductive metal or metal alloy. The optional plating seed layer may comprise Cu, a Cu alloy, Ir, an Ir alloy, Ru, a Ru alloy (e.g., TaRu alloy) or any other suitable noble metal or noble metal alloy having a low metal plating overpotential. By "low metal overpotential", it is meant Cu or Cu Alloy can be plated with the seed layer. Typically, Cu or a Cu alloy plating seed layer is employed, when a Cu metal is to be subsequently formed within the openings 16.

The thickness of the plating seed layer may vary depending on the material of the optional plating seed layer as well as the technique used in forming the same. Typically, the plating seed layer has a thickness from 2 to 80 nm.

The plating seed layer can be formed by a conventional deposition process including, for example, CVD, PECVD, ALD, and PVD. In embodiments when a plating seed layer is formed, the plating seed layer would be located between the diffusion barrier 18 and the conductive material 20.

The conductive material 20 includes, for example, any material having a conductivity of bulk Cu or greater. Some examples of conductive materials that can be employed as conductive material 20 include, but are not limited to polySi, a conductive metal, an alloy comprising at least two conductive metals, a conductive metal silicide or combinations thereof. In some embodiments in which the conductive material 20 is a conductive metal or metal alloy, the conductive material 20 can include Cu, W, Al, or alloys such as AlCu.

The conductive material 20 can be formed atop the diffusion barrier 18 utilizing any deposition process including, for example, CVD, PECVD, PVD, sputtering, plating, chemical solution deposition and electroless plating. It is observed that when plating is performed, a plating seed layer is typically formed prior to plating the conductive material onto the diffusion barrier 18.

Figure 5:
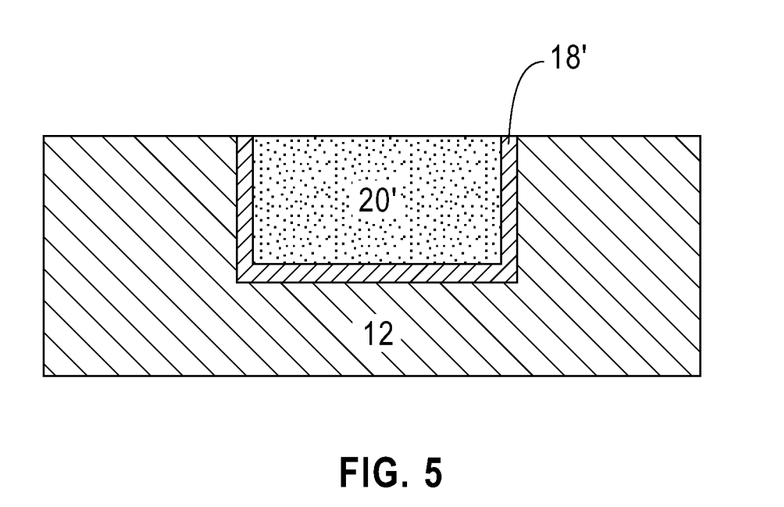
FIG. 5 is a pictorial representation (through a cross sectional view) illustrating the structure of FIG. 4 after performing a planarization process.

After deposition of the conductive material 20, the structure is subjected to a planarization process such as, for example, chemical mechanical polishing (CMP) and/or grinding. The planarization process provides a planar structure such as is shown in FIG. 5 in which the upper surfaces of the dielectric material 12, the diffusion barrier 18' (which is now U-shaped) and the conductive material 20' are substantially co-planar with each other. During the planarization process, the remaining layer of pad material 14 is typically removed from the structure.

Although not illustrated in the drawings, a small divot, i.e., recess, can form in the upper corner of conductive material 20' in a region that lies adjacent to the remaining diffusion barrier

18'. The conductive material 20' (i.e., conductive region) and the diffusion barrier 18' that remain are embedded within dielectric material 12. The dielectric material 12 including the conductive material 20' and the diffusion barrier embedded therein collectively can be referred to as an interconnect structure.

Figure 6:
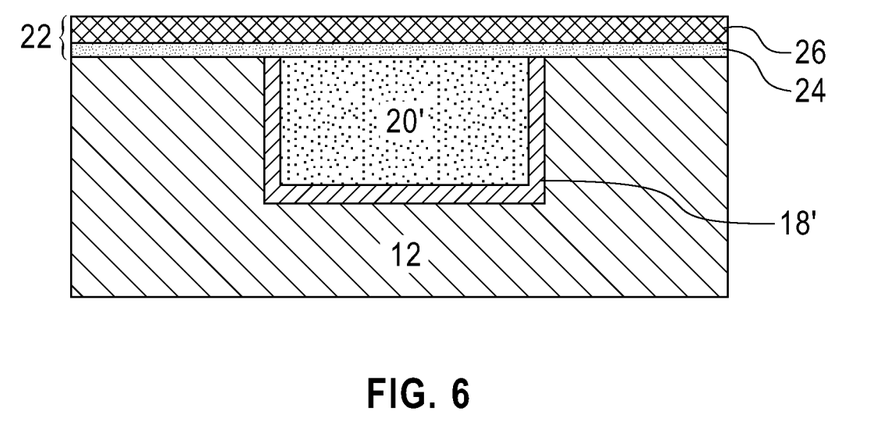
FIG. 6 is a pictorial representation (through a cross sectional view) illustrating the structure of FIG. 5 after forming a multilayered cap, which comprises, from bottom to top, a first layer comprising silicon nitride and a second layer comprising at least one of boron nitride and carbon boron nitride, atop the planarized structure.

Referring now to FIG. 6, there is illustrated the structure of FIG. 5 after forming a multilayered cap 22 atop the upper surfaces of the dielectric material 12, the diffusion barrier 18' and conductive material 20' (i.e., the interconnect structure). The multilayered cap 22 includes, from bottom to top, a first layer 24 comprising silicon nitride, and a second layer 26 comprising at least one of boron nitride and carbon boron nitride.

The multilayered cap 22, which includes the first layer 24 and the second layer 26, has a thickness of less than 30 nm, with a thickness of from 6 nm to 25 nm being more typical. The multilayered cap 22 of the present disclosure has a uniform thickness across the entire surface of the structure shown in FIG. 5. By "uniform" it is meant that the multilayered cap 22 has a thickness variation of less than 5 Å across the entire surface of the structure shown in FIG. 5.

As stated above, the first layer 24 of the multilayered cap 22 comprises silicon nitride. The thickness of the first layer 24 of the multilayered cap 22 is typically from 1 nm to 25 nm, with a thickness for the first layer 24 of the multilayered cap 22 of from 2 nm to 6 nm being more typical.

The first layer 24 of the multilayered cap 22 can be formed utilizing a deposition process including, but not limited to chemical vapor deposition, plasma enhanced chemical vapor deposition, atomic layer deposition, plasma enhanced atomic layer deposition and physical vapor deposition. In one embodiment, plasma enhanced chemical vapor deposition is used in forming the first layer 24 of the multilayered cap 22 and thereafter the first layer 24 film surface can be treated with a reactive nitrogen containing plasma such as, for example, a plasma with $N_2$ and or $NH_3/Ar$ gases). Plasma enhanced chemical vapor deposition (PECVD) is a type of a chemical vapor deposition process that utilizes plasma to enhance chemical reaction rates of the precursors used in forming a film, such as, for example, silicon nitride. PECVD processing allows deposition at lower temperatures (typically less than 500° C.) than a non-plasma chemical vapor deposition process, which is often critical in the manufacture of interconnect structures. In one embodiment, the precursor includes a silicon-containing precursor such as, for example, a silane or dichlorosilane and a nitrogen-containing precursor such as, ammonia.

The second layer 26 of the multilayered cap 22 comprises at least one of boron nitride and carbon boron nitride. Stated in other terms, the second layer 26 of the multilayered cap 22 is a film selected from the group consisting of boron nitride, carbon boron nitride and multilayered combinations thereof. The thickness of the second layer 26 of the multilayered cap 22 is typically from 5 nm to 29 nm, with a thickness for the second layer 26 of the multilayered cap 22 of from 3 nm to 10 nm being more typical.

In one embodiment of the present disclosure, the second layer 26 of the multilayered cap 22 is a layer of boron nitride. In another embodiment of the present disclosure, the second layer 26 of the multilayered cap 22 is a layer of carbon boron nitride. In yet another embodiment of the present disclosure, the second layer 26 of the multilayered cap 22 is a stack of boron nitride and carbon boron nitride. In the latter embodiment, the order of the boron nitride and carbon boron nitride can vary within the stack that comprises the second layer 26 of the multilayered cap 22. For example, the stack that comprises the second layer 26 of the multilayered cap 22 can include, from bottom to top, boron nitride and carbon boron nitride. Alternatively, the stack that comprises the second layer 26 of the multilayered cap 22 can include, from bottom to top, carbon boron nitride and boron nitride.

The second layer 26 of the multilayered cap 22 is formed utilizing at least one of plasma enhanced chemical vapor deposition, plasma enhanced atomic layer deposition and atomic layer deposition. That is, the second layer 26 of the multilayered cap 22 is formed utilizing plasma enhanced chemical vapor deposition, plasma enhanced atomic layer deposition, atomic layer deposition, or any combination of two or all three of the deposition processes. All of the aforementioned processes deposit a conformal second layer 26 atop the first layer 24.

In embodiments in which plasma enhanced chemical vapor deposition is employed in forming the second layer 26 of the multilayered cap 22 that comprises boron nitride and/or carbon boron nitride, a single precursor or multiple precursors can employed. Illustrative examples of boron nitride precursors that can be employed include, but are not limited to diborane and ammonia and/or/nitrogen ($B_2H_6+NH_3/N_2$), and borazine ($(BN)_3(NH_3)=B_3N_3H_6$) and $N_2$ or $NH_3$. Illustrative examples of carbon boron nitride precursors include, but are not limited to trimethyl borazine, and triethynyl trimethyl borazine. In some embodiments, a carbon boron nitride layer can be formed utilizing one of the boron nitride precursors mentioned above together with a hydro carbon-containing precursor such as, for example, butadiene, hexene, hexadiene, butene, and alkynes precursor such as acetylene, and phenyl acetylene.

In embodiments in which plasma enhanced chemical vapor deposition is utilized in forming the second layer 26 of the multilayered cap 22, the plasma enhanced chemical vapor deposition is performed at a temperature from 250° C. to 400° C., with a temperature from 300° C. to 350° C. being more typical. The deposition pressure that is employed when plasma enhanced chemical vapor deposition is employed in forming the second layer 26 of the multilayered cap 22 is typically from 1 Torr to 10 Torr, with a deposition pressure from 2 Torr to 8 Torr being more typical.

Atomic layer deposition (ALD) and plasma enhanced atomic layer deposition (PE_ALD) are thin film deposition techniques that are based on the sequential use of a gas phase chemical process. The majority of ALD and PE_ALD reactions use two precursors. These precursors react with a surface one-at-a-time in a sequential manner. By exposing the precursors to the growth surface repeatedly, a thin film is deposited. ALD and PE_ALD are self-limiting (the amount of film material deposited in each reaction cycle is constant), sequential surface chemistry that deposits comformal thin films of materials onto substrates of varying compositions.

ALD (and PE_ALD) is similar in chemistry to CVD (PECVD), except that the ALD reaction breaks the CVD reaction into two half-reactions keeping the precursor materials separate during the reaction. Due to the characteristics of self-limiting and surface reactions, ALD film growth makes atomic scale deposition control possible. Separation of the precursors is accomplished by pulsing a purge gas (typically nitrogen or argon) after each precursor pulse to remove excess precursor from the process chamber and prevent 'parasitic' CVD deposition on the substrate.

The growth of second layer 26 by ALD or PE_ALD includes the following characteristic four steps: 1) Exposure of the first precursor. 2) Purge or evacuation of the reaction chamber to remove the non-reacted precursors and the gaseous reaction by-products. 3) Exposure of the second precursor—or another treatment to activate the surface again for the reaction of the first precursor. 4) Purge or evacuation of the reaction chamber. The precursors used in ALD and PE-ALD can include the precursors mentioned above for forming the second layer 26 by PECVD.

In some embodiments of the present disclosure in which atomic layer deposition is used in forming the second layer 26 of the multilayered cap 22, the atomic layer deposition can be performed at a temperature from 20° C. to 500° C., with a temperature of from 50° C. to 300° C. being more typical. The deposition pressure that is employed when atomic layer deposition is employed in forming the second layer 26 of the multilayered cap 22 is typically from 0.1 Torr to 100 Torr, with a deposition pressure from 1 Torr to 10 Torr being more typical.

In other embodiments of the present disclosure in which plasma enhanced atomic layer deposition is used in forming the second layer 26 of the multilayered cap 22, the plasma enhanced atomic layer deposition can be performed at a temperature from 50° C. to 400° C., with a deposition temperature of from 250° C. to 350° C. being more typical. The deposition pressure that is employed when plasma enhanced atomic layer deposition is employed in forming the second layer 26 of the multilayered cap 22 is typically from 0.1 Torr to 10 Torr, with a deposition pressure from 1 Torr to 8 Torr being more typical.

Figure 7:
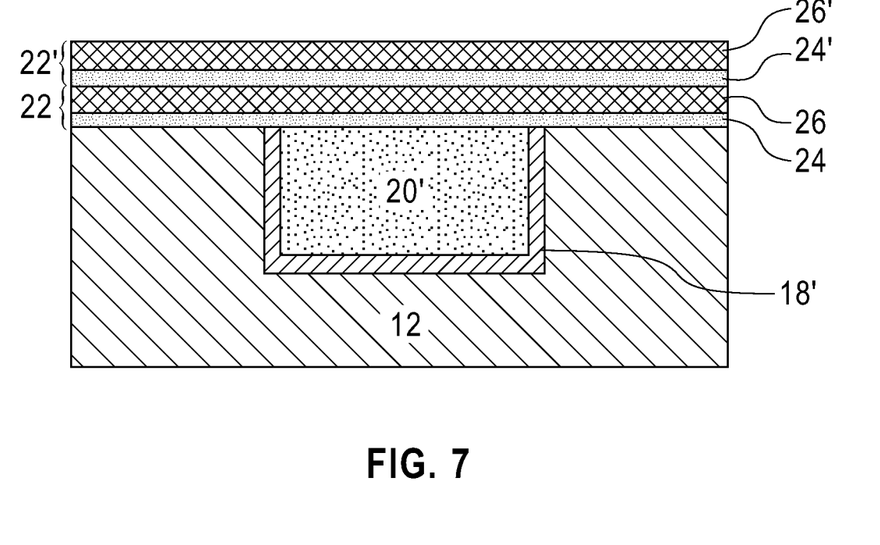
FIG. 7 is pictorial representation (through a cross sectional view) illustrating the structure of FIG. 6 after forming another multilayered cap comprising, from bottom to top, another first layer comprising silicon nitride and another second layer comprising at least one of boron nitride and carbon boron nitride, atop the underlying multilayered cap.

Reference is now made to FIG. 7, which illustrates another embodiment of the present disclosure in which at least one other multilayered cap 22' comprising at least one other first layer 24' comprising silicon nitride and at least one other second layer 26' comprising one of boron nitride and carbon boron nitride, atop the previously formed multilayered cap 22. The least one other multilayered cap 22' can include the same materials, and thickness as mentioned above for the previously formed multilayered cap 22. The at least one other multilayered cap 22' can be formed utilizing at least one of plasma enhanced chemical vapor deposition, atomic layer deposition and plasma enhanced atomic layer deposition as mentioned above in forming the previously formed multilayered cap 22.

The multilayered cap 22 (or 22') of the present disclosure has an effective dielectric constant of 5.3 or less, with an effective dielectric constant from 4.0 to 5.0 being more typical. The effective dielectric constant is a measurement of the dielectric constant of the entire multilayered cap 22 (22') and thus it does not represent the dielectric constant of the individual layers 24 (24') and 26 (26') that constituent the multilayered cap 22 (22').

Figure 8:
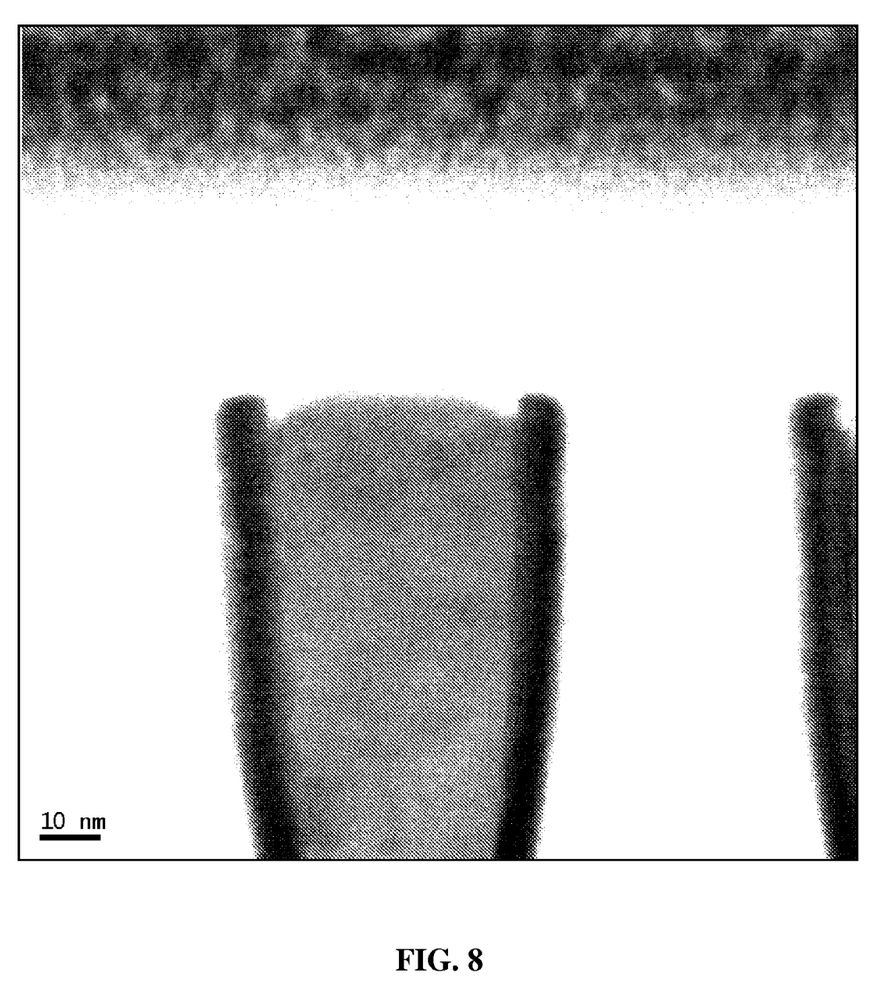
FIG. 8 is a cross-sectional scanning electron micrograph (SEM) of an interconnect structure including a multilayered cap in accordance with the present disclosure.

The multilayered cap of the present disclosure conformally fills seams or voids to reduce stress cracking in the substrate. This can be observed by viewing the SEM illustrated in FIG. 8 and comparing the same to the prior art SEMs illustrated in FIGS. 1A and 1B. In FIG. 8, the multilayered cap used was in accordance with an embodiment of the present disclosure and showed excellent step coverage conformality.

The multilayered cap of the present disclosure provides improved electromigation resistance to the underlying conductive material 20' and it also prevents oxidation of the conductive material 20'. By the term "prevents oxidation" it is meant that the oxygen content in the underlying substrate, i.e., interconnect structure, is typically, on the order of 100 ppm or less.

In addition, the multilayered cap of the present disclosure has improved UV stability stress control as compared with prior art dielectric caps and also no substantially leakage current is observed when the multilayered cap 22 (22') of the present disclosure is employed within an interconnect structure. By "improved UV stability stress control", it is meant the film stress and film thickness changes are less than 20%. By "substantially no leakage current", it is meant the leakage increase is less than 20% from its original value.

The multilayered cap 22 (22') of the present disclosure also provides a structure in which the breakdown voltage is about 3.5 MV/cm or greater, with a breakdown voltage of from 4 MV/cm to 5 MV/cm being more typical. It is observed that the above leakage current and down voltages are maintained even after curing the multilayered cap of the present disclosure.

The multilayered cap 22 (22") of the present disclosure has compressive stress properties, and, as such, the disclosed multilayered cap has the ability to conformally fill in the seams or voids mentioned above. That is, the multilayered cap 22 (22') of the present disclosure is under compression. The multilayered cap 22 (22') of the present disclosure has a compressive stress of from 1 MPa to 1000 MPa, with a compressive stress from 100 MPa to 400 MPa being more typical. The multilayer caps also remain under compressive stress upon exposure to UV cure. In one embodiment, the UV cure is performed at 400° C., 5 min, in Ar. Other UV cure conditions can also be employed in the present disclosure. The post UV cure (using the above conditions) compressive stress value of the multilayer cap is normally in the range of 50 MPa to 300 MPa.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a multilayered cap comprising:
providing a substrate;
forming a first layer comprising silicon nitride on an upper surface of said substrate, wherein said forming the first layer comprises physical vapor deposition, followed by treating a surface region of said silicon nitride with a reactive nitrogen containing plasma; and
forming a second layer comprising at least one of boron nitride and carbon boron nitride on an upper surface of the first layer, wherein said second layer is formed by at least one of plasma enhanced chemical vapor deposition, plasma enhanced atomic layer deposition and atomic layer deposition.

2. The method of claim 1, wherein said providing the substrate includes providing a dielectric material having at least one conductive region embedded therein.

3. The method of claim 1, wherein said second layer is formed by plasma enhanced chemical vapor deposition, said plasma enhanced chemical vapor deposition is performed at a temperature from 250° C. to 400° C.

4. The method of claim 1, wherein said second layer is formed by atomic layer deposition, said atomic layer deposition is performed at a temperature from 50° C. to 500° C.

5. The method of claim 1, wherein said second layer is formed by atomic layer deposition, and said atomic layer deposition is performed at a temperature from 20° C. to 500° C.

6. The method of claim 1, further comprising forming at least one other first layer comprising silicon nitride and at least one other second layer comprising one of boron nitride and carbon boron nitride atop the first and second layers.

7. The method of claim 1, wherein said second layer comprises both boron nitride and carbon boron nitride, said boron nitride is located beneath said carbon boron nitride.

8. The method of claim 1, wherein said second layer comprises both boron nitride and carbon boron nitride, said carbon boron nitride is located beneath said boron nitride.

9. A method of forming a multilayered cap comprising:
providing a substrate;
forming a first layer comprising silicon nitride on an upper surface of said substrate, wherein said forming the first layer comprises plasma enhanced chemical vapor deposition, followed by treating a surface region of said silicon nitride with a reactive nitrogen containing plasma; and
forming a second layer comprising at least one of boron nitride and carbon boron nitride on an upper surface of the first layer, wherein said second layer is formed by at least one of plasma enhanced chemical vapor deposition, plasma enhanced atomic layer deposition and atomic layer deposition.

10. The method of claim 9, further comprising curing, wherein said curing occurs after forming the first and second layers of the multilayered cap.

11. The method of claim 9, wherein said providing the substrate includes providing a dielectric material having at least one conductive region embedded therein.

12. The method of claim 9, wherein said second layer is formed by plasma enhanced chemical vapor deposition, said plasma enhanced chemical vapor deposition is performed at a temperature from 250° C. to 400° C.

13. The method of claim 9, wherein said second layer is formed by atomic layer deposition, said atomic layer deposition is performed at a temperature from 50° C. to 500° C.

14. The method of claim 9, wherein said second layer is formed by atomic layer deposition, and said atomic layer deposition is performed at a temperature from 20° C. to 500° C.

15. The method of claim 9, further comprising forming at least one other first layer comprising silicon nitride and at least one other second layer comprising one of boron nitride and carbon boron nitride atop the first and second layers.

16. The method of claim 9, wherein said reactive nitrogen containing plasma comprises a plasma containing nitrogen gas.

17. The method of claim 9, wherein said reactive nitrogen containing plasma comprises a plasma containing $NH_3/Ar$ gases.

18. The method of claim 9, wherein said second layer comprises both boron nitride and carbon boron nitride.

19. The method of claim 18, wherein said boron nitride is located beneath said carbon boron nitride.

20. The method of claim 18, wherein said carbon boron nitride is located beneath said boron nitride.

* * * * *